United States Patent [19]

James

[11] Patent Number: 6,140,820
[45] Date of Patent: Oct. 31, 2000

[54] MEASURING CELL VOLTAGES OF A FUEL CELL STACK

[75] Inventor: David E. James, Latham, N.Y.

[73] Assignee: Plug Power Inc., Latham, N.Y.

[21] Appl. No.: 09/472,649

[22] Filed: Dec. 27, 1999

[51] Int. Cl.[7] ................. G01N 27/416; H01M 10/44; H01M 10/46
[52] U.S. Cl. ............................ 324/434; 320/120
[58] Field of Search ..................... 320/116, 117, 320/119, 120, 122, FOR 116, FOR 114; 324/425, 426, 430, 433, 434

[56] References Cited

U.S. PATENT DOCUMENTS

| 2,621,231 | 12/1952 | Madlar et al. . |
|---|---|---|
| 4,622,508 | 11/1986 | Matteau et al. . |
| 4,931,738 | 6/1990 | MacIntyre et al. . |
| 5,170,124 | 12/1992 | Blair et al. . |
| 5,763,113 | 6/1998 | Meltser et al. . |

*Primary Examiner*—Edward H. Tso
*Attorney, Agent, or Firm*—Trop, Pruner & Hu, P.C.

[57] ABSTRACT

A system that is usable with a stack of fuel cells that have cell terminals includes scanning units and a circuit. The scanning units are coupled to the stack and establish different groups of the fuel cells. Each scanning unit has a ground that is referenced to a different one of the cell terminals, and each scanning unit is adapted to measure the voltages of the fuel cells in an associated one of the groups and indicate the measured voltages. The circuit is adapted to communicate with the scanning units to receive the indicated voltages.

27 Claims, 2 Drawing Sheets

MEASURING CELL VOLTAGES OF A FUEL CELL STACK

BACKGROUND

The invention relates to measuring cell voltages of a fuel cell stack.

A fuel cell is an electrochemical device that converts chemical energy produced by a reaction directly into electrical energy. For example, one type of fuel cell includes a proton exchange membrane (PEM), often called a polymer electrolyte membrane, that permits only protons to pass between an anode and a cathode of the fuel cell. At the anode, diatomic hydrogen (a fuel) is reacted to produce hydrogen protons that pass through the PEM. The electrons produced by this reaction travel through circuitry that is external to the fuel cell to form an electrical current. At the cathode, oxygen is reduced and reacts with the hydrogen protons to form water. The anodic and cathodic reactions are described by the following equations:

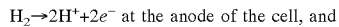

$H_2 \rightarrow 2H^+ + 2e^-$ at the anode of the cell, and

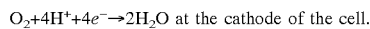

$O_2 + 4H^+ + 4e^- \rightarrow 2H_2O$ at the cathode of the cell.

Because a single fuel cell typically produces a relatively small voltage (around 1 volt, for example), several fuel cells may be formed out of an arrangement called a fuel cell stack to produce a higher voltage. The fuel cell stack may include plates (graphite composite or metal plates, as examples) that are stacked one on top of the other, and each plate may be associated with more than one fuel cell of the stack. The plates may include various channels and orifices to, as examples, route the reactants and products through the fuel cell stack. Several PEMs (each one being associated with a particular fuel cell) may be dispersed throughout the stack between the anodes and cathodes of the different fuel cells.

The health of a fuel cell stack may be determined by monitoring the individual differential terminal voltages (herein called cell voltages) of the fuel cells. In this manner, a particular cell voltage may vary under load conditions and cell health over a range from −1 volt to +1 volt. The fuel cell stack typically may include a large number of fuel cells, and thus, common mode voltages (voltages with respect to a common voltage (ground)) of the terminals of the fuel cells may be quite large (i.e., some of the voltages of the terminals may be near 100 volts, for example). Unfortunately, semiconductor devices that may be used to measure the cell voltages typically are incapable of receiving high common mode voltages (voltages over approximately 18 volts, for example). One solution may be to use resistor dividers to scale down the terminal voltages. However, the tolerances of the resistors may introduce measurement errors.

SUMMARY

In one embodiment of the invention, a system that is usable with a stack of fuel cells that have cell terminals includes scanning units and a circuit. The scanning units are coupled to the stack and establish different groups of the fuel cells. Each scanning unit has a ground that is referenced to a different one of the cell terminals, and each scanning unit is adapted to measure the voltages of the fuel cells in an associated one of the groups and indicate the measured voltages. The circuit is adapted to receive the indications of the measured voltages from the scanning units.

Advantages and other features of the invention will become apparent from the following description, from the drawing and from the claims.

DETAILED DESCRIPTION

Figure 2:
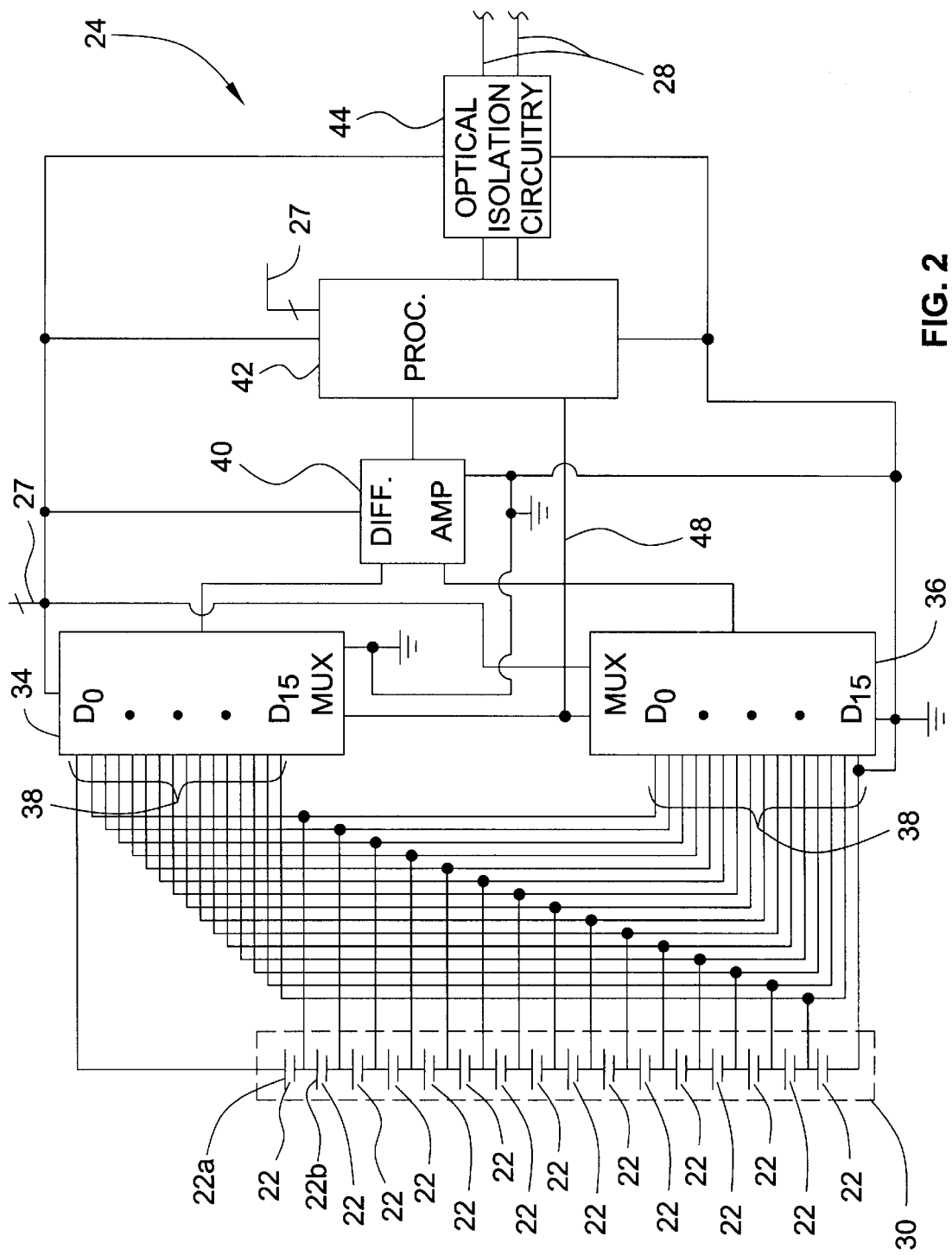
FIG. 2 is a schematic diagram of a scanning unit of the circuit of FIG. 1 according to an embodiment of the invention.

Referring to FIG. 2, an embodiment 18 of a fuel cell voltage monitoring circuit in accordance with the invention measures the voltages (herein referred to as cell voltages) of fuel cells 22 of a fuel cell stack 20. Unlike conventional arrangements, the circuit 18 divides the task of measuring the cell voltages among voltage scanning units 24 that may have ground references at potentials greater than a ground reference 23 of the fuel cell stack 20. Due to this arrangement, the circuit 18 may measure the cell voltages that are associated with large common mode voltages (with respect to the ground reference 23), as further described below.

More particularly, each voltage scanning unit 24 measures the cell voltages of a different group of the fuel cells 22 and furnishes indications of the measured voltages to a main processor 29 that may, for example, determine the minimum cell voltage of the stack 20, the maximum cell voltage of the stack 20 and/or the average cell voltage of the stack 20 from the measured cell voltages; and the main processor 29 may communicate these determined values to other circuitry that controls operation of the stack 20 based on these values.

To measure a particular cell voltage, the corresponding voltage scanning unit 24 performs a differential voltage measurement across two terminals 38 (i.e., a positive terminal and a negative terminal) of the cell 22. Thus, each voltage scanning unit 24 receives the voltages of the terminals 38 of the cells 22 of its group and uses these terminal voltages to measure the corresponding cell voltages. The farther (in terms of the relative potential) a particular terminal 38 is from the ground reference 23 of the stack 20, the higher the common mode voltage with respect to the ground reference 23. For example, near the top of the stack 30 (farthest from the ground reference 23), the common mode voltage of a particular terminal 38 may be near one hundred volts with respect to the ground reference 23.

Figure 1:
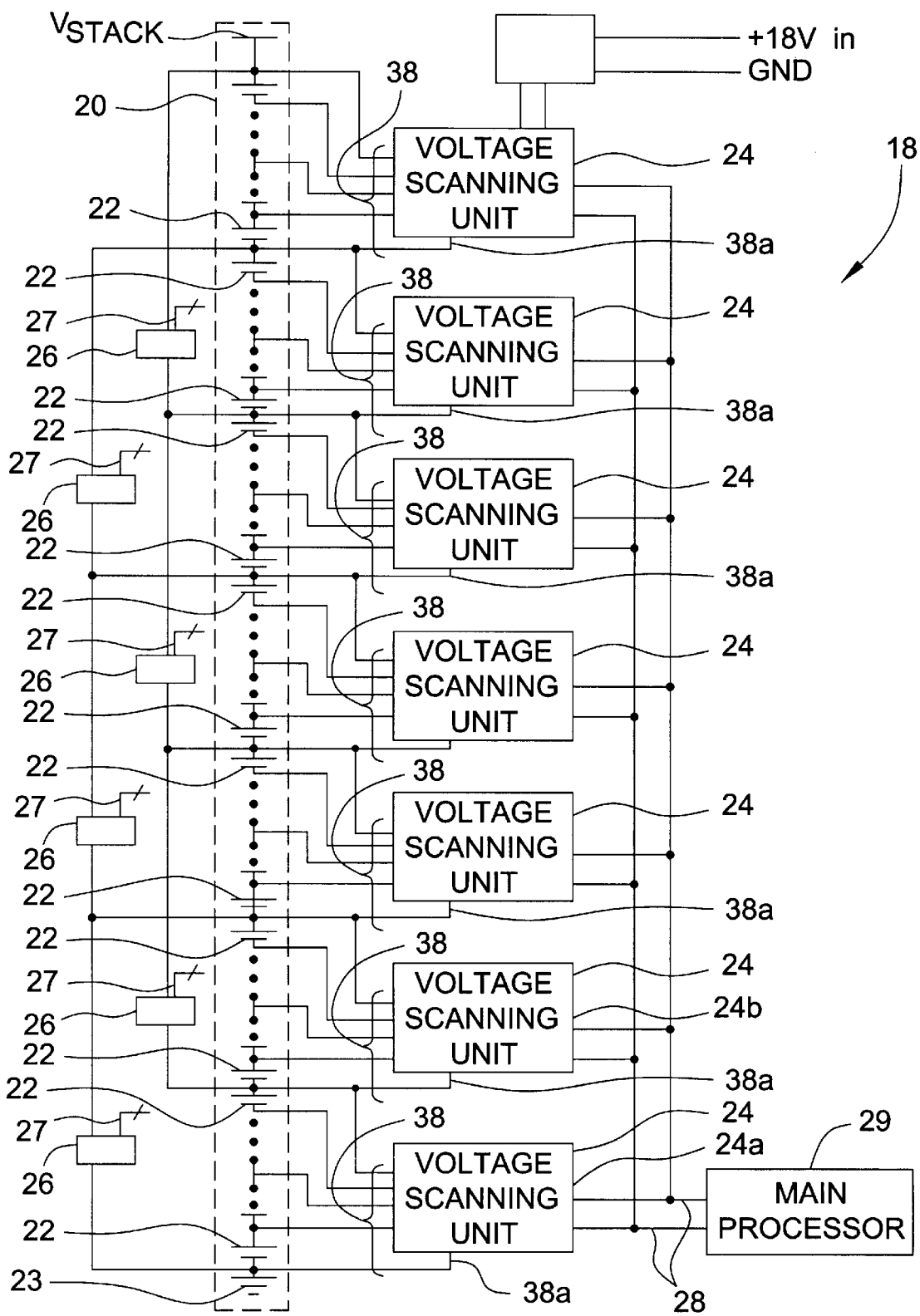
FIG. 1 is a schematic diagram of a circuit to measure fuel cell voltages according to an embodiment of the invention.

However, due to the grounding of the voltage scanning units 24, the scanning units do not experience such high common mode voltages. Instead, the voltage scanning units 24 may have grounds that are referenced to terminals 38 that have voltages above the ground reference 23. In particular, in some embodiments, each voltage scanning unit 24 has a ground that is coupled to one of the terminals 38 of its associated group of fuel cells 22. Therefore, regardless of the size of the stack 20, each voltage scanning unit 24 only "sees" its associated group of cells, as the position of the group in the stack 20 does not affect the associated common mode voltages. Thus, no voltage scanning unit 24 experiences a high terminal voltage with respect to its ground. As a result of this arrangement, each voltage scanning unit 24 is modular, and the voltage monitoring circuit 18 may be formed by fewer or less voltage scanning units 24 than are depicted in FIG. 1.

As an example, in some embodiments, the voltage monitoring circuit 18 may include seven (as an example) voltage scanning units 24 that divide the stack 20 into seven non-overlapping groups of fuel cells 22. For this example, the number of fuel cells 22 in each group may be approximately sixteen, and it is assumed for this example that each cell voltage is approximately one volt. The group of sixteen fuel cells 22 that are closest to the ground reference 23 may form a group of fuel cells 22 that are scanned by the voltage scanning unit 24a. Because of the relatively low voltages (i.e., voltages less than or equal to approximately sixteen volts, for example) of the terminals 38 of this group with respect to the ground reference 23, the ground of the voltage scanning unit 24a is coupled to the ground reference 23.

Continuing the example above, the next (with respect to the ground reference 23) group of sixteen fuel cells 22 form a group of cells 22 that are measured by the voltage scanning unit 24b. The terminals 38 from this group have much larger voltages (i.e., voltages between approximately 16 and 32 volts, for example) with respect to the ground reference 23, and such large common mode voltages may exceed the maximum common mode voltage that may be received by semiconductor devices (described below) that form the voltage scanning unit 24b. However, to avoid this problem, the lowest voltage terminal 38 (relative to the ground reference 23) of the group forms the ground for the voltage scanning unit 24b. As a result, the voltage scanning unit 24b experiences approximately the same common mode voltages as the voltage scanning unit 24a. Similarly, the other voltage scanning units 24 experience approximately the same common mode voltages, as the ground of each voltage scanning unit 24 is coupled to the cell terminal 38 that has the lowest voltage (with respect to the ground reference 23) of the terminals of the associated group of fuel cells 22.

Besides the voltage scanning units 24 and the main processor 29, the voltage monitoring circuit 18 may also include voltage regulators 26 to furnish operating power to the voltage scanning units 24. In this manner, in some embodiments, each voltage regulator 26 provides one or more regulated supply voltages (via power supply line(s) 27) to a different one of the voltage scanning units 24. The ground of each voltage regulator 26 is connected to the same ground as the voltage scanning unit 24 to which the voltage regulator 26 supplies power. As depicted in FIG. 1, the voltage regulator 26 may receive power from more than one (two, for example) groups of fuel cells 22.

Among the other features of the voltage monitoring circuit 18, in some embodiments, the main processor 30 and the voltage scanning units 24 are coupled together via a serial bus 28. In this manner, the serial bus 28 may include, for example, a transmit (TX) line and a receive (RX) line for purposes of establishing communication between the main processor 29 and the voltage scanning units 24. In some embodiments, each voltage scanning unit 24 has a different serial bus address, and the main processor 29 queries (via the serial bus 28) each voltage scanning unit 24 for indications of the measured cell voltages from its groups. In some embodiments, the main processor 29 may retrieve indications of the measured voltages from each voltage scanning unit 24 several times a second, as an example.

FIG. 2 depicts one of many possible embodiments of the voltage scanning unit 24 along with an associated group 30 of fuel cells. As shown, the voltage scanning unit 24, in some embodiments, includes a differential amplifier 40 that measures the cell voltages of the group 30 one at a time. In this manner, to measure a particular cell voltage, the differential amplifier 40 receives a voltage that is indicative of the positive terminal of the cell 22 and a voltage that is indicative of the negative terminal of the cell 22. The amplifier 40 takes the difference of these two voltages to form an analog signal that is furnished to a processor 42 of the voltage scanning unit 24.

In some embodiments, the processor 42 may be a microcontroller, for example, that includes an analog-to-digital converter (ADC) to convert the analog signal that is furnished by the amplifier 40 into a digital value. In this manner, the processor 42 may also include or be coupled to a random access memory (RAM) to store the digital values that indicate the measured cell voltages for all of the cells in the group 30. When the voltage scanning unit 24 is queried by the main processor 29 (see FIG. 1) for the measured voltages, the processor 42 communicates (via optical isolation circuitry 44) with the main processor 29 over the serial bus 28 to transmit indications of the stored digital values to the main processor 29.

In some embodiments, the processor 42 may operate multiplexing circuitry to selectively control which cell voltage is being measured by the amplifier 40. In this manner, the processor 42 may use control lines 48 to select one cell 22 at a time for measurement using two analog multiplexers 34 and 36. The output terminals of the multiplexers 34 and 36 are coupled to the positive and negative input terminals, respectively, of the amplifier 40. More particularly, in some embodiments, input terminals D0–D15 of the multiplexer 34 are connected to the terminals 38 of the group 30 that have the sixteen highest voltages, and the input terminals D0–D15 of the multiplexer 36 are connected to the terminals 38 of the group 30 that have the sixteen lowest voltages. Thus, due to this arrangement, the processor 42 may obtain a voltage of a particular cell 22 by causing the multiplexer 34 to select the positive terminal of the particular cell 22 and by causing the multiplexer 36 to select the negative terminal of the particular cell 22.

For example, when the processor 42 causes the control lines 48 to indicate "0000b" (where the suffix "b" denotes a binary representation), the multiplexer 34 couples the positive terminal of the cell 22a to the positive input terminal amplifier 40, and the multiplexer 36 couples the negative terminal of the cell 22a to the negative input terminal of the amplifier 40. As another example, when the processor 42 causes the control lines 48 to indicate "0001b", the multiplexer 34 couples the positive terminal of the cell 22b to the positive input terminal of the amplifier 40, and the multiplexer 36 couples the negative terminal of the cell 22b to the negative input terminal of the amplifier 40. Thus, as depicted by these examples, the processor 42 may selectively assert signals on the control lines 48 to sequentially measure the cell voltages of the group 30.

As depicted in FIG. 2, in some embodiments, the multiplexers 34 and 36, the differential amplifier 40, the processor 42 and the optical isolation circuitry 44 receive supply voltages via the power lines 27 from the voltage regulator 26 (see FIG. 1) that is associated with the group 30; and these circuits are connected to the ground that is established by the lowest voltage terminal of the group 30.

As an example, the stack 20 may furnish voltages, in approximate one volt increments, up to approximately ninety to one hundred fifty volts. In other embodiments, the stack 20 may furnish voltages that are greater than one hundred fifty volts. However, the components of each voltage scanning unit 24 do not receive such large common mode voltages. For example, the multiplexer 34, 36 is capable of receiving input voltages up to its power supply level that has a maximum value of eighteen volts, and as another example, the differential amplifier 40 is capable of input voltages up to its power supply voltage that may have a maximum value of approximately thirty volts.

Other embodiments are within the scope of the following claims. For example, a voltage monitoring circuit, similar to the voltage monitoring circuit 18, may be used to measure the voltages of a stacked array of voltage sources other than a fuel cell stack. As an example, this stacked array may be a bank of batteries, for example.

While the invention has been disclosed with respect to a limited number of embodiments, those skilled in the art, having the benefit of this disclosure, will appreciate numerous modifications and variations therefrom. It is intended that the appended claims cover all such modifications and variations as fall within the true spirit and scope of the invention.

What is claimed is:

1. A system usable with a stack of fuel cells that have cell terminals, comprising:

scanning units coupled to the stack and establishing different groups of the fuel cells, each scanning unit having a ground referenced to a different one of the cell terminals and being adapted to measure the voltages of the fuel cells in an associated one of the groups and indicate the measured voltages; and a circuit adapted to receive the indicated voltages from the scanning units.

2. The system of claim 1, wherein the circuit and the stack have a common ground connection.

3. The system of claim 1, wherein the ground of at least one of the scanning units is connected to the cell terminal of one of the cells in the associated group.

4. The system of claim 1, wherein at least one of the scanning units has an associated maximum input voltage that is less than the voltage of at least one of the terminals of the associated group with respect to a ground of the fuel cell stack.

5. The system of claim 4, wherein the maximum input voltage is between approximately 16 to 30 volts.

6. The system of claim 4, wherein the stack provides a voltage between approximately 90 and 150 volts.

7. The system of claim 1, wherein the stack provides a voltage between approximately 90 and 150 volts.

8. The system of claim 1, wherein the stack provides a voltage greater than 150 volts.

9. The system of claim 1, further comprising:

voltage regulators, each regulator providing power to at least one of the scanning units and having a ground in common with the ground associated with one of said at least one of the scanning units.

10. The system of claim 1, wherein at least one of the scanning units comprises:

a differential amplifier adapted to measure the voltages of the fuel cells in the associated group; and multiplexing circuitry to selectively couple the terminals of the fuel cells in the associated group to the differential amplifier.

11. The system of claim 10, wherein said at least one of the scanning units further comprises:

a processing unit adapted to operate the multiplexing circuitry to selectively couple the terminals of the fuel cells in the associated group to the differential amplifier and receive a signal from the differential amplifier indicative of the measured voltages.

12. The system of claim 1, wherein at least one of the scanning units comprises:

optical isolation circuitry to communicate the indication to the circuit.

13. The system of claim 1, further comprising:

a bus coupled between the scanning units and the circuit, the bus being used by the circuit to communicate with the scanning units.

14. A system usable with a serially coupled array of voltage sources that have terminals, comprising:

scanning units coupled to the array and establishing different groups of the voltage sources, each scanning unit having a ground referenced to a different one of the terminals and being adapted to measure the voltages of the voltage sources in an associated one of the groups and indicate the measured voltages; and a circuit adapted to communicate with the scanning units to receive the indicated voltages.

15. The system of claim 14, wherein the circuit and the array have a common ground connection.

16. The system of claim 14, wherein the ground of at least one of the scanning units circuit is connected to the terminal of one of the voltage sources in the associated group.

17. The system of claim 14, wherein at least one of the scanning units has an associated maximum input voltage that is less than the voltage of at least one of terminals of the associated group with respect to a ground of the array.

18. The system of claim 14, wherein the array comprises a fuel cell stack.

19. The system of claim 14, wherein the array comprises a battery bank.

20. The system of claim 14, further comprising:

voltage regulators, each regulator providing power to at least one of the scanning units and having a ground in common with the ground associated with one of said at least one of the scanning units.

21. The system of claim 14, wherein at least one of the scanning units comprises:

a differential amplifier adapted to measure the voltages of the voltage sources in the associated group; and multiplexing circuitry to selectively couple the terminals of the voltage sources in the associated group to the differential amplifier.

22. The system of claim 21, wherein said at least one of the scanning units further comprises:

a processing unit adapted to operate the multiplexing circuitry to selectively couple the terminals of the voltage sources in the associated group to the differential amplifier and receive a signal from the differential amplifier indicative of the measured voltages.

23. The system of claim 14, wherein at least one of the scanning units comprises:

optical isolation circuitry to communicate the indication to the circuit.

24. The system of claim 14, further comprising:

a bus coupled between the scanning units and the circuit, the bus being used by the circuit to communicate with the scanning units.

25. A method usable with a stack of fuel cells, comprising:

dividing the fuel cells into groups;

establishing ground references at the different terminals of the cells, each ground reference being associated with one of the groups; and measuring the voltages of the fuel cells in each group using the associated ground reference.

26. The method of claim 25, wherein the ground reference that is associated with at least one of the scanning units is connected to the terminal of one of the cells in the associated group.

27. The method of claim 25, wherein the measuring comprises:

for each group, sequentially measuring the cell voltages one at a time.

* * * * *